United States Patent [19]

Ishitani et al.

[11] Patent Number: 5,154,647
[45] Date of Patent: Oct. 13, 1992

[54] ELECTRICAL JUNCTION BLOCK FOR AUTOMOBILE AND A METHOD FOR MANUFACTURING THE SAME

[75] Inventors: Hayao Ishitani; Masayuki Sakurai; Yasuo Morita, all of Tokyo, Japan

[73] Assignee: The Furukawa Electric Co., Ltd., Tokyo, Japan

[21] Appl. No.: 570,230

[22] Filed: Aug. 21, 1990

[30] Foreign Application Priority Data

Aug. 24, 1989 [JP] Japan ................................. 1-216085

[51] Int. Cl.$^5$ ...................... C08L 53/00; C08F 283/08
[52] U.S. Cl. ...................................... 439/933; 525/66; 525/397
[58] Field of Search ............................ 439/34, 76, 933; 525/397, 66; 29/830

[56] References Cited

U.S. PATENT DOCUMENTS

| | | |
|---|---|---|
| 4,429,943 | 2/1984 | Inoue . |
| 4,433,088 | 2/1984 | Haaf et al. ............................ 525/397 |
| 4,681,915 | 7/1987 | Bates et al. ........................... 525/397 |
| 4,781,600 | 11/1988 | Sugiyama et al. ...................... 439/45 |
| 4,839,425 | 6/1989 | Mawatari et al. ..................... 525/397 |
| 4,943,399 | 7/1990 | Taubitz ................................. 525/397 |

FOREIGN PATENT DOCUMENTS

| | | |
|---|---|---|
| 0091835 | 10/1983 | European Pat. Off. . |
| 0295693 | 12/1988 | European Pat. Off. . |
| 0308255 | 3/1989 | European Pat. Off. . |
| 2054623 | 2/1981 | United Kingdom . |
| 2115623 | 9/1983 | United Kingdom . |

OTHER PUBLICATIONS

J. J. Laverty, "Effect of Heat Aging on the Properties of a Nylon 6,6/Poly(Phenylene Oxide) Blend", Mar. 1988, vol. 28, pp. 360–366, Polymer Engineering and Science.

A bibliography relating to Polymer alloy issued in Japan, pp. 65 to 70.

*Primary Examiner*—Neil Abrams
*Attorney, Agent, or Firm*—Frishauf, Holtz, Goodman & Woodward

[57] ABSTRACT

An electrical junction block for an automobile which can be used in an atmosphere at temperatures equal to or higher than 70° C. and in which metal bus bars formed in preset circuit patterns are used as a wiring connection inside a case body. The case body of the electrical junction block is molded by using a nylon polymer alloy. A method for manufacturing an electrical junction block for automobiles. The electrical junction block having upper and lower case bodies which are engaged with each other. The upper and lower case bodies are molded by using a nylon polymer alloy, and functional parts are mounted without incurring a moisture absorbing process.

13 Claims, 2 Drawing Sheets

ELECTRICAL JUNCTION BLOCK FOR AUTOMOBILE AND A METHOD FOR MANUFACTURING THE SAME

BACKGROUND OF THE INVENTION

This invention relates to an electrical junction block used for the wiring of the electrical equipment of an automobile and a method for manufacturing the same.

For example, as shown in FIG. 1, in the electrical junction block of an automobile, metal bus bars 1 formed in preset circuit patterns are arranged on respective insulative plates 2, the insulative plates 2 are put upon others and set into a case formed of an upper case body 3A and a lower case body 3B, and functional parts such as fuses 4 and relays (not shown) are mounted thereon. The electrical junction block is connected to input-output electric wires via a connector 5. Further, a cover is mounted if required.

Since such an electrical junction block is restricted by the installation place thereof and the way for installing the same, it is required to design the same extremely efficiently and rationally. Particularly, in recent years, as the number of electrical devices of an automobile increases and the function thereof becomes greater, the circuit in the electrical junction block becomes significantly larger and the number of functional parts to be mounted becomes larger, so that the size of the electrical junction block will be inevitably made larger.

The importance for the manufacturing of the electrical junction block is to finish portions of bus bars, which are bent and form a tab, and wherein the curved and end portions of bus bars have high dimensional accuracy so as to enhance the easy assembling and the dimensional stability after the assembling. In particular, the dimensional accuracy for the tab portion must be high because it is formed to pass through the case body.

Various materials can be considered to be used for the material of the electrical junction block, but in general, a synthetic resin which is called an engineering plastic is used from the viewpoint of the working temperatures, formability and workability, economical efficiency and the like. Among the engineering plastics, nylon which is excellent in the heat resistance and the economical efficiency is frequently used since the ambient temperature of the electrical junction block used particularly in the engine compartment becomes equal to or higher than 70° C. Nylon has advantages that it can be efficiently formed into a complicated configuration and it has a sufficiently high mechanical strength at high temperatures.

In contrast, nylon has a defect that it has a moisture absorption property and the dimension thereof significantly varies in the dried/moisture absorbed states. That is, a nylon article immediately after the molding is set in the dried state and is weak against mechanical shock, and it absorbs moisture with time and the dimension thereof varies.

Therefore, in the actual manufacturing process, a nylon article is subjected to a moisture absorbing process after molding until an equilibrium condition is attained and is then fed to the succeeding stage. The moisture absorbing process is generally effected by placing the molded product in an atmosphere with high humidity and at a high temperature for up to several tens of hours, but the quantity of work actually effected for the process is extremely large and the installation cost for effecting the process is extremely great. Further, a large variation in the dimension of the nylon article caused by moisture absorption means that the dimension of the nylon article tends to be changed even if it has been subjected to the moisture absorption process after molding, that is, the nylon article will absorb moisture and the dimension thereof will change when it is placed in a high temperature and a high himidity condition, and in contrast, the nylon article gives off moisture and the dimension thereof is changed when it is placed in a dried condition.

When the dimension of the case body of the electrical junction block is changed, the integration of the case body with the bus bars cannot be easily attained and the degree of matching between various portions will be lowered. In particular, since through holes are formed in a tub setting portions of the case body, it becomes impossible to insert the tabs into the through holes if a match in dimension between them cannot be attained. If the tab is forcedly inserted into the through hole, the bus bar will be bent or broken, thereby causing a short-circuit or breakage in the circuit. The same problems as described above will arise when a variation in dimension caused according to a dry/moisture absorption condition after assembling has occurred.

An influence due to the variation in dimension becomes larger as the electrical junction block becomes larger, and a variation in dimension can be suppressed within a tolerance if the length of one side thereof is equal to or less than 170 mm and no practical problem occurs. However, if the length is set to be larger than the above value, the variation in dimension cannot be suppressed within the tolerance, causing the assembling stability and the reliability of the electrical junction block to be remarkably lowered.

OBJECTS AND SUMMARY OF THE INVENTION

An object of this invention is to provide an electrical junction block for an automobile in which variation in dimension caused by variation in moisture is small and which is high in reliability and a method for manufacturing the same.

Another object of this invention is to provide an electrical junction block for an automobile which can be easily manufactured and is excellent in the assembling stability and a method for manufacturing the same.

In order to attain the above objects, the construction of an electrical junction block for an automobile according to this invention comprises metal bus bars formed in preset circuit patterns as wirings in a case body which is used in an atmosphere at temperatures equal to or higher than 70° C. and is formed of molded nylon polymer alloy. Further, a method for manufacturing electrical junction blocks for automobiles according to this invention comprises the following steps in the method of manufacturing the electrical junction block for an automobile used in an atmosphere at temperatures equal to or higher than 70° C.

It comprises a step of molding an upper case body on which mounting portions for mounting functional parts and mounting connection connectors for input/output wires are formed and a lower case body which is engaged with the upper case body and on which mounting portions for mounting connection connectors for input/output wires are formed by using a nylon polymer alloy; a step of setting insulative plates on which metal bus bars formed in preset circuit patterns are arranged into the upper and lower case bodies without subjecting the upper and lower case bodies to a moisture absorption process; and a step of mounting the functional parts on the upper case body.

Since variation in dimension of a nylon article caused by moisture absorption is large as described hereinbefore, a nylon polymer alloy is used in this invention. A nylon polymer alloy used in this invention is a multi-component polymer (consisting of two or more kinds of high polymers) formed by compounding nylon and polyphenylene ether, ABS resin, polypropylene or the like based on the morphological design and is a material which is excellent in the heat resistance and mechanical strength and can be practically used from the viewpoint of the formability and economical efficiency thereof.

The nylon polymer alloy can be formed into a case body of the electrical junction block by a general injection molding method, for example. The case body molded of nylon polymer alloy is stable in its dimension and can be used for the succeeding step such as the assembling step as it is does not effect a moisture absorption process or the like after molding. Further, after molding, it has a sufficiently high mechanical strength as it is not subjected to a moisture absorbing process or the like. Further, a variation in dimension thereof caused according to the moisture absorbed/dried condition is little even after the electrical junction block is assembled, so that the case body can be prevented from being warped or bent, and a bending of the bus bar and short-circuit due to the dimensional difference between the case body and the bus bar will not occur.

As described above, the nylon polymer alloy having the above-described excellent characteristic is formed of a resin material consisting of a nylon (polyamide) component and a component such as polyphenylene ether, ABS resin, or polypropylene. A combination of nylon (polyamide) and polyphenylene ether is particularly preferable as the material of the case body of the electrical junction block for automobiles according to this invention, and for example, a polymer alloy formed of a combination of nylon (polyamide) of 40 to 60 weight % and polyphenylene ether of 60 to 40 weight % is frequently used.

Such a material can be easily formed into a case body of the electrical junction block even if it has an extremely complicated shape. Further, the safety factor for the wall strength of the case body and the strength of installing brackets of the case body in the case that the weight of a finished product becomes large may be designed to be high. The electrical junction block which has the case body formed of the above material can be formed into a product having an elongated service life and high performance so that it can be used over all the entire application period of the automobile or the period of time during which replacement of the electrical junction block is not necessary can be made longer and the frequency of replacements can be reduced.

In the nylon polymer alloy used in this invention, in addition to the above material, compatibility accelerating agents or aging resistant additives generally used by those skilled in the art or coloring additives may be added, or fillers such as inorganic powder or glass staples may be added without influencing the performance thereof.

The nylon polymer alloy used in this invention is a composite material so that the uniformity and the compatibility in the alloy of respective components constituting the alloy may influence the performance of the electrical junction block manufactured. The degree of influence is determined and selected according to the characteristic value in the high-temperature aging test for the polymer alloy material, impact strength characteristic values and melt flow characteristic values.

That is, it is preferable that, in the high-temperature aging test for the nylon polymer alloy used in this invention, a tensile elongation retention thereof is 50% or more, an Izod impact value (with notches) is 12 kgcm/cm or more and a melt flow rate under 5 kg load and at a temperature of 280° C. is more than 20 g/10 minutes.

In this case, the high-temperature aging test is effected by leaving a test piece defined by JIS K 7113 under a high temperature of 170° C. for 24 hours for heat aging according to JIS K 7212, measuring the original test piece and the aged test piece according to a method of JIS K 7113 and deriving the tensile elongation retention (%) by the following equation.

Tensile elongation retention (%)={elongation percentage of aged test piece (%)/elongation percentage of original test piece (%)}×100.

The impact strength characteristic values for the Izod impact values (with notches) are derived by effecting the test according to JIS K 7110.

The melt flow characteristic values for the melt flow rate are derived by effecting the test according to JIS K 7210 in a condition that a temperature is set at 280° C. and a test load of 5.0 kgf is used.

When the nylon polymer alloy used in this invention lies in the range of the above characteristics, each component in the alloy exhibits sufficient compatibility and become uniform. As a result, the electrical junction block formed of the molded case body keeps a high performance for a long period of time and the strength performance will not be lowered in a short period of time when the junction block is used. Further, a case body in a complicated shape can be easily formed and the molded product exhibits an excellent performance in the mechanical strength.

In a case where a tensile elongation retention is less than 50% or an Izod impact value (with notches) is less than 12 kgcm/cm in the high-temperature aging test for the nylon polymer alloy, the electrical junction block formed of a case body which is formed by using such a material is insufficient in the compatibility of material and in the uniformity. Therefore, the electrical junction block formed of such a material is deteriorated in the wall strength of the case body and in the function of holding the strength performance of the installing portion, and as a result, the service life thereof becomes short and it may be necessary to replace the junction block in a short period of time. Further, if the wall for ensuring the strength of the case body is made thicker in order to make the wall sufficiently mechanically strong, the whole size increases and the application range of the electrical junction block is considerably restricted.

In a case where the melt flow rate of the nylon polymer alloy is less than 20 g/10 minutes, the compatibility and the uniformity of the material are insufficient and the flowability of the material is lowered. As a result, when a case body of the electrical junction block of a complicated shape is formed, it takes a great deal of effort to determine the case body structure and mold structure, and even if the case body can be formed with a desired shape, abnormal conditions such as warp, short shot or microcrack may occur in the case body thus formed since it is unnatural to form the case body (the flowability and the solidification by cooling in the mold are not suitable), and thus it is difficult to form the case body with a high precision.

Therefore, when an electrical junction block for an automobile which has become large in size and complicated in shape is formed to have a sufficiently large strength and high performance with a high precision, it is necessary to use a nylon polymer alloy having the above-described characteristics.

The above-described objects and other objects, features and advantages of the present invention will become more apparent in the following detailed description when considered in conjunction with the accompanying drawings.

DETAILED DESCRIPTION

Embodiment 1

Figure 1:
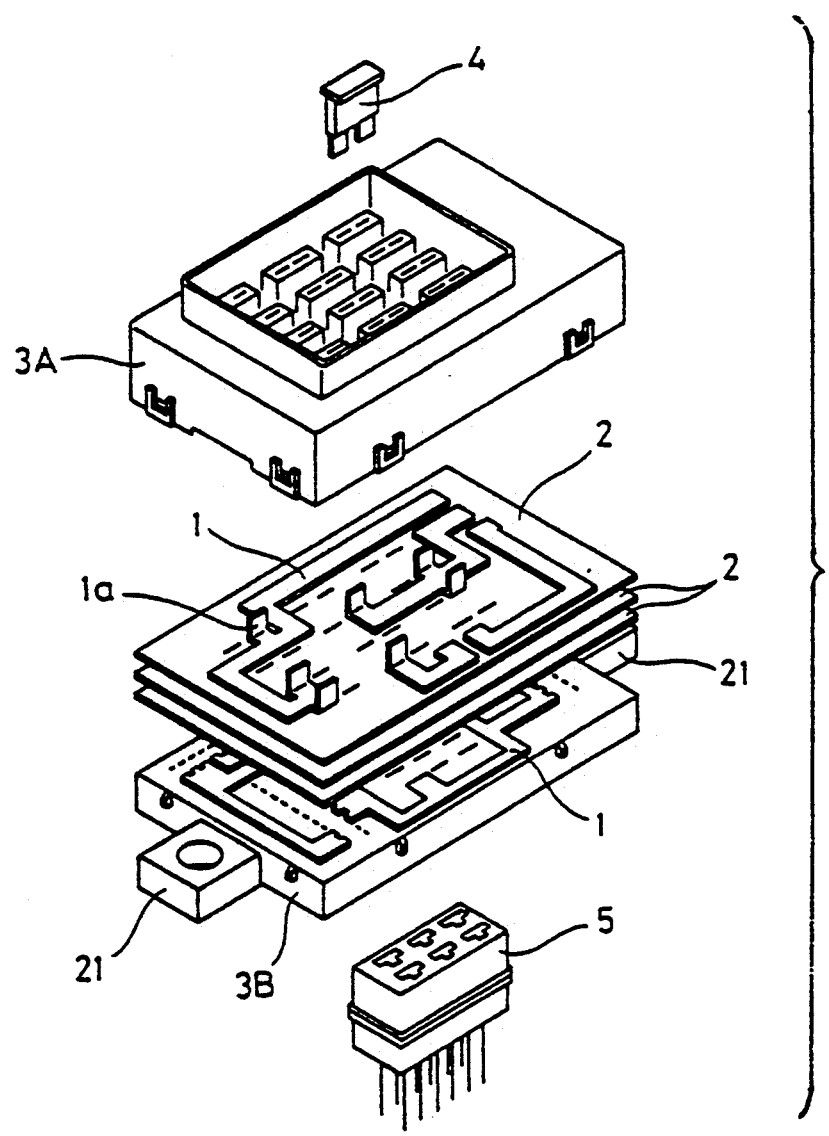
FIG. 1 is an exploded perspective view of an electrical junction block for an automobile according to one embodiment of this invention and having the same construction as the conventional electrical junction block for an automobile.

An electrical junction block for an automobile shown in FIG. 1 is installed in the engine compartment (the ambient temperature of a installing portion of the electrical junction block will be 80° C. at maximum) of the automobile and has an upper case body 3A and a lower case body 3B. The case bodies 3A and 3B are 180 mm in length and 100 mm in width, installing portions for fuses 4 are formed on the upper case body 3A and a mounting portion (not shown) of a connector 5 to which input-/output wires are connected and installing brackets 21 for installation on an automobile are formed on the lower case body 3B. Further, bus bars 1 of copper are arranged in the four-layered structure with insulation plates 2 disposed therebetween inside the case bodies 3A and 3B. Each of the bus bars 1 constitutes a circuit of a preset pattern, the end portion thereof is bent to form a connection tab 1a for electric input/output.

The upper case body 3A and lower case body 3B are formed by injection-molding a nylon polymer alloy A (which is a molding resin consisting of nylon-66 and polyphenylene ether as the main component, specific gravity 1.09). In the aging test in which the nylon polymer alloy A was left for 24 hours at a temperature of 170° C., a tensile elongation retention thereof was 55%, an Izod impact value (with notches) was 13.2 kgcm/cm and a melt flow rate under 5 kg load and at a temperature of 280° C. was 26 g/10 minutes.

After the case bodies 3A and 3B having the abovedescribed characteristics are formed, the bus bars 1, insulation plates 2 and other intermediate connection terminals are incorporated without effecting a process such as a moisture absorption process, and the fuses 4 are mounted to complete the electrical junction block. In this case, since the bus bars 1 and functional parts such as the fuses 4 can be mounted on the formed upper case body 3A and lower case body 3B as they are, the manufacturing process of the electrical junction block can be greatly simplified in comparison with the conventional method and time required for manufacturing the same can be reduced.

After completion of the junction block, the electrical junction block was left for one week in an atmosphere in which the relative humidity was 50% and the temperature was 70° C. and then the mounting condition of the fuses and the connector was tested. The result showed that the mounting condition of these parts was substantially the same as that obtained immediately after the completion of the electrical junction block and was extremely good. Further, variation in dimension of each part of the case body caused by the moisture absorption was extremely little and was stable.

After the electrical junction block was installed in the engine compartment (the ambient temperature is 80° C. at maximum) of the actual automobile and tested, it exhibited an extremely good performance even though there was variation in humidity caused by the dry/moisture absorption condition and sufficiently performed the function as the electrical junction block in substantially the entire service life of the automobile.

Comparison Example 1 and 2

As comparison example 1, an electrical junction block for an automobile of the same construction as that of the embodiment 1 and made of a nylon-6 (grade for injection molding) was produced. In this case, the case bodies 3A and 3B were formed by injection molding, and without effecting any process after the molding, such as a moisture absorption process, the bus bars 1, insulation plates 2, and other intermediate connection terminals were incorporated into the case bodies 3A and 3B, and the fuses 4 were mounted to the upper case body 3A, thereby obtaining an electrical junction block.

The electrical junction block obtained had a poor impact strength at the installing brackets 21, etc., and when handled roughly, cracks were produced, thus requiring care in packing and handling.

After the electrical junction block was left to stand for one year at room temperature and at normal humidity, changes in its dimensions were observed, which poses a difficulty in engaging and disengaging the fuses, connectors, etc. Further, when the electrical conductivity of the junction block was tested, a signal representing a short-circuit caused by bending of the bus bars was recorded.

Comparison example 2 was produced taking account of changes of the dimensions due to the moisture absorption process. Namely, case bodies 3A and 3B smaller in size (99.5%) than those used in the comparison example 1 were prepared, and were subjected to a moisture absorption process for 15 hours in an atmosphere of 80° C. and 90% relative humidity. Thereafter, the bus bars 1, the fuses 4, etc., were incorporated into the case bodies 3A and 3B, as in the comparison example 1, thereby producing an electrical junction block.

The electrical junction block obtained had improved performance at the installing brackets 21 in respect of the production of cracks and difficulty in engaging and disengaging the fuses, connectors, etc. due to changes in dimensions with time. However, this electrical junction block still showed a large variation in the properties and a large change in the dimensions in response to dry/moisture conditions. Therefore, in a dry or low-humidity season, e.g., in winter, cracking at the installing brackets 21 occurred and a difficulty often arose in engaging and disengaging the fuses, connectors, etc. Furthermore, the moisture absorption process, carried out for the case bodies 3A and 3B of this example, results in an increase in the production time of electrical junction blocks, and requires establishment of special facilities for this process.

Embodiments 2 to 4

Instead of the nylon polymer alloy A used in the embodiment 1, a nylon polymer alloy B (which is a molding resin consisting of nylon-66 of 50 weight % and polyphenylene ether of 50 weight % as the main component) is used in the embodiment 2, a nylon polymer alloy C (which is a molding resin consisting of nylon-6.6 of 48 weight % and ABS resin of 52 weight % as the main component) is used in the embodiment 3, and a nylon polymer alloy D (which is a molding resin consisting of nylon-6 of 35 weight % and polyphenylene ether of 65 weight % as the main component) is used in the embodiment 4, and electrical junction blocks for an automobile of the same construction as that of the embodiment 1 is formed, respectively.

The characteristics of the nylon polymer alloys B, C and D are as follows.

|  | B | C | D |
|---|---|---|---|
| Tensile Elongation Retention (%) after aging at 170° C. × 24 hours | 15 | 9 | 28 |
| Izod Impact Value (with notches) (kgcm/cm) | 13 | 18 | 9 |
| Melt Flow Rate (g/10 minutes) 280° C., 5 kg load | 32 | 18 | 24 |

After tests were effected by installing the electrical junction blocks of the embodiments 2 and 4 on the engine compartments (the maximum ambient temperature is 80° C.) of actual automobiles, it was found that variation in dimension occurred with time in the articles made from nylon polymer alloys B and D. As the result, a considerable looseness occurred between the electrical junction block bodies 3A and 3B after it run by 25000 Km in the case of the electrical junction block of the embodiment 2 using the polymer alloy B and after it run by 23000 Km in the case of the electrical junction block of the embodiment 4 using the polymer alloy D. Further, microcracks occurred in the surface of the installing bracket 21 and the electrical junction block must be replaced by a new one.

On the other hand, in the case of the electrical junction block of the embodiment 3 using the polymer alloy C, significant warp was observed in the wall portion of the upper case body 3A, but the electrical junction block could be assembled and completed in the same manner as in the case of the embodiment 1. The same test was made by installing the electrical junction block on an actual automobile, and as the result, the same phenomenon as that in the case of the embodiment 2 was observed after it run by 15000 Km.

Embodiment 5

Figure 2:
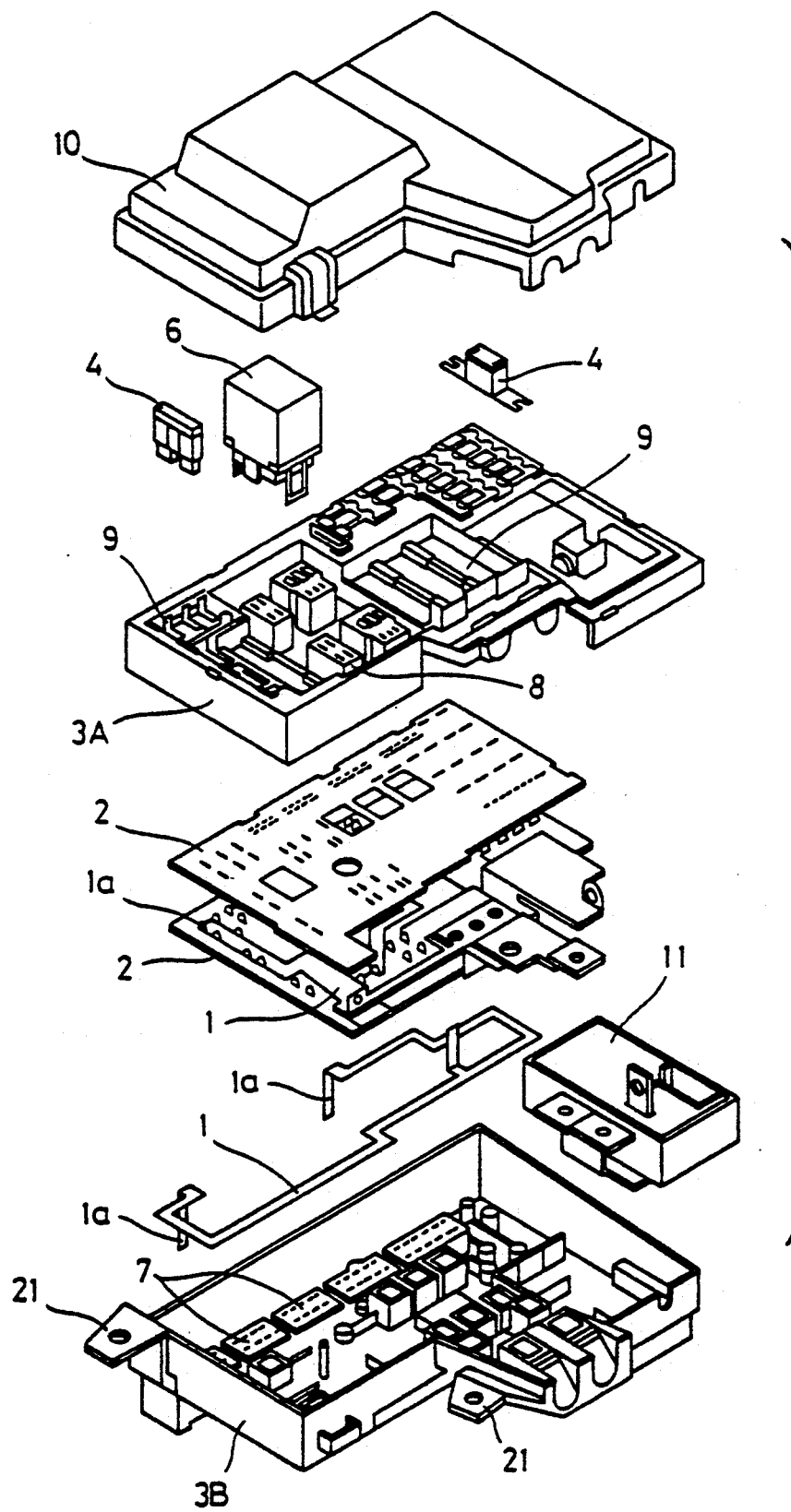
FIG. 2 is an exploded perspective view of an electrical junction block for an automobile according to another embodiment of this invention.

FIG. 2 shows an electrical junction block according to another embodiment and the length of a longer side is set to 190 mm. A mounting portion 8 for a relay 6 and a mounting portion 9 for fuses 4 are formed on an upper case body 3A, and a connector mounting portion 7 to which input/output wires are connected and an installing brackets 21 for installation on an automobile are formed on a plurality of locations of a lower case body 3B. Further, bus bars 1 formed of copper are arranged in the four-layered structure with insulation plates 2 disposed therebetween inside the case bodies 3A and 3B. The bus bars 1 respectively constitute preset circuits and those portions of the bus bars which are inserted into the relay mounting portion 8, the fuse mounting portion 9 and connector mounting portion 7 are bent to form tabs 1a. In the drawing, the numeral 10 denotes a cover and the numeral 11 denotes an electric load detector unit.

The upper case body 3A and lower case body 3B of the above construction were formed by injection-molding a nylon polymer alloy E (which is a molding resin consisting of nylon-66 and polyphenylene ether as the main component, specific gravity 1.09, namely, 'LEMALLOY' made by Mitsubishi Petrochemical Co., Ltd.). In the aging test in which the nylon polymer alloy E was left for 24 hours at a temperature of 170° C., a tensile elongation retention thereof was 72%, an Izod impact value (with notches) was 15 kgcm/cm and a melt flow rate under 5 kg load and at a temperature of 280° C. was 35 g/10 minutes.

After the case bodies 3A and 3B having the abovedescribed characteristics are formed, the bus bars 1, insulation plates 2, electric load detector unit 11, nuts, intermediate connection terminals and the like are incorporated without effecting a process such as a moisture absorption process, and the relays 6 and fuses 4 are mounted and the cover 10 is set to complete the electrical junction block.

After completion of the junction block, the electrical junction block was left for one week in an atmosphere in which the relative humidity was 50% and the temperature was 70° C. and then the mounting condition of the relays 6, fuses 4 and the connector was tested.

The result showed that the mounting condition of these parts was substantially the same as that obtained immediately after the completion of the electrical junction block and was extremely good. Further, variation in dimension of each part of the case body caused by the moisture absorption was extremely little and was stable.

Comparison Example 3

For comparison, the upper and lower case bodies were formed by injection-molding nylon ('LEONA' made by Asahi Chemical Industry Co.) in the way of the injection molding using the same mold and an electrical junction block of the same construction as that of the embodiment 5.

In this case, the mounting condition of various parts and the assembling stability immediately after formation were as good as those obtained in the case of the embodiment 5. However, after the electrical junction block was left for one week in an atmosphere in which the relative humidity was 50% and the temperature was 70° C., the dimension thereof significantly varied and the assembling and mounting of various parts were difficult.

Further, after the assembled electrical junction block was left in the same condition as described above, an attempt was made to connect the connector by insertion but the connector could not be plugged in because of misalignment of the tab. Further, the electrical conduction test was made and a signal caused by a short-circuit due to bending of the bus bar was recorded.

What is claimed is:

1. An electrical junction block for an automobile which can be used in an atmosphere at temperatures equal to or higher than 70° C, comprising at least one metal bus bar formed in at least one preset circuit pattern as a wiring means in a case body, said case body being formed from a molded nylon polymer alloy, wherein said nylon polymer alloy consists essentially of 40 to 60 weight % nylon and 60 to 40 weight % polyphenylene ether or an ABS resin, as the main components thereof; said nylon polymer alloy having (i) a tensile elongation retention in an aging test in which said alloy is left for 24 hours at a temperature of 170° C. of 50% or more, (ii) a notch Izod impact value of 12 Kg.cm/cm or more and (iii) a melt flow rate under a 5 kg load and at a temperature of 280° C. of 20 g/10 minutes or more.

2. The electrical junction block for an automobile according to claim 1, wherein said case body comprises an upper case body and a lower case body which are engaged with each other and which are formed by injection-molding said nylon polymer alloy to have at least one side which is equal to or longer than 170 mm, a plurality of mounting portions for functional parts, a plurality of connector mounting portions to which input/output wires are connected on said upper case body, a plurality of connector mounting portions to which input/output wires are connected on said lower case body, and disposed inside said case body are a plurality of metal bus bars having connection tabs for electric input and output, formed in present circuit patterns, disposed inside said case body on and between insulation plates.

3. The electrical junction block for an automobile according to claim 1, wherein the polymer alloy has a specific gravity of 1.09, the tensile elongation retention is 55%, the Izod impact value is 13.2 kgcm/cm and the melt flow rate is 26 g/10 minutes.

4. The electrical junction block for an automobile according to claim 1, wherein polymer alloy consists of 50 weight % nylon and 50 weight % polyphenylene ether.

5. The electrical junction block for an automobile according to claim 1, wherein the polymer alloy has a specific gravity of 1.09, the tensile elongation retention is 72%, the Izod impact value is 15 kgcm/cm and the melt flow rate is 35 g/10 minutes.

6. The electrical junction block for an automobile according to claim 2, wherein the polymer alloy has a specific gravity of 1.09, the tensile elongation retention is 55%, the Izod impact value is 13.2 kgcm/cm and the melt flow rate is 26 g/10 minutes.

7. The electrical junction block for an automobile according to claim 2, wherein polymer alloy consists of 50 weight % nylon and 50 weight % polyphenylene ether.

8. The electrical junction block for an automobile according to claim 2, wherein the polymer alloy has a specific gravity of 1.09, the tensile elongation retention is 72%, the Izod impact value is 15 kgcm/cm and the melt flow rate is 35 g/10 minutes.

9. A method for manufacturing an electrical junction block for an automobile which can be used in an atmosphere at temperatures equal to or higher than 70° C., comprising:

molding an upper case body on which mounting portions for mounting functional parts and mounting portions for mounting connection connectors for input/output wires are formed and molding a lower case body which is engaged with said upper case body and on which mounting portions for mounting connection connectors for input/output wires are formed by using a nylon polymer alloy, wherein said nylon polymer alloy consists essentially of 40 to 60 weight % nylon and 60 to 40 weight % polyphenylene ether or an ABS resin, as the main components thereof; said nylon polymer alloy having (i) a tensile elongation retention in an aging test in which said alloy is left for 24 hours at a temperature of 170° C. of 50% or more, (ii) a notch Izod impact value of 12 Kg.Cm/cm or more and (iii) a melt flow rate under a 5 kg load and at a temperature of 280° C. of 20 g/10 minutes or more;

disposing insulative plates, on which metal bus bars formed in preset circuit patterns are disposed, into said upper and lower case bodies, without subjecting said upper and lower case bodies to a moisture absorption process; and mounting one or more functional parts on said upper case body.

10. The method for manufacturing an electrical function block for an automobile according to claim 5, wherein said upper and lower case bodies are formed to have at least one side which is equal to or longer than 170 mm.

11. The method for manufacturing an electrical junction block for an automobile according to claim 10, wherein the polymer alloy has a specific gravity of 1.09, the tensile elongation retention is 55%, the Izod impact value is 13.2 kgcm/cm and the melt flow rate is 26 g/10 minutes.

12. The method for manufacturing an electrical junction block for an automobile according to claim 10, wherein polymer alloy consists of 50 weight % nylon and 50 weight % polyphenylene ether.

13. The method for manufacturing an electrical junction block for an automobile according to claim 10, wherein the polymer alloy has a specific gravity of 1.09, the tensile elongation retention is 72%, the Izod impact value is 15 kgcm/cm and the melt flow rate is 35 g/10 minutes.

* * * * *